United States Patent
Perletti et al.

(10) Patent No.: US 11,317,219 B2
(45) Date of Patent: Apr. 26, 2022

(54) METHOD FOR MANUFACTURING A THIN FILTERING MEMBRANE AND AN ACOUSTIC TRANSDUCER DEVICE INCLUDING THE FILTERING MEMBRANE

(71) Applicant: STMICROELECTRONICS S.R.L., Agrate Brianza (IT)

(72) Inventors: Matteo Perletti, Boltiere (IT); Federico Vercesi, Milan (IT); Silvia Adorno, Novate Milanese (IT); Giorgio Allegato, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 234 days.

(21) Appl. No.: 16/693,003

(22) Filed: Nov. 22, 2019

(65) Prior Publication Data
US 2020/0092659 A1    Mar. 19, 2020

Related U.S. Application Data

(62) Division of application No. 16/128,288, filed on Sep. 11, 2018, now Pat. No. 10,555,091.

(30) Foreign Application Priority Data

Sep. 15, 2017   (IT) .......................... 102017000103489

(51) Int. Cl.
*H04R 19/00* (2006.01)
*H04R 19/04* (2006.01)
(Continued)

(52) U.S. Cl.
CPC .......... *H04R 19/04* (2013.01); *B81B 7/0029* (2013.01); *B81C 1/00309* (2013.01);
(Continued)

(58) Field of Classification Search
CPC ........ H04R 19/04; H04R 31/00; H04R 1/086; H04R 1/2807; H04R 19/005;
(Continued)

(56) References Cited

U.S. PATENT DOCUMENTS

| 4,287,501 A | 9/1981 | Tominaga et al. |
| 4,533,795 A | 8/1985 | Baumhauer, Jr. et al. |

(Continued)

FOREIGN PATENT DOCUMENTS

| CN | 1401979 A | 3/2003 |
| CN | 1401980 A | 3/2003 |

(Continued)

OTHER PUBLICATIONS

Morrissey et al., "Selection of materials for reduced stress packaging of a microsystem," *Sensors and Actuators* 74:178-181, 1999.

*Primary Examiner* — Matthew A Eason
(74) *Attorney, Agent, or Firm* — Seed Intellectual Property Law Group LLP

(57) ABSTRACT

A method for manufacturing a filtering module comprising the steps of: forming a multilayer body comprising a filter layer of semiconductor material and having a thickness of less than 10 μm, a first structural layer coupled to a first side of the filter layer, and a second structural layer coupled to a second side, opposite to the first side, of the filter layer; forming a recess in the first structural layer, which extends throughout its thickness; removing selective portions, exposed through the recess, of the filter layer to form a plurality of openings, which extend throughout the thickness of the filter layer; and completely removing the second structural layer to connect fluidically the first and second sides of the filter layer, thus forming a filtering membrane designed to inhibit passage of contaminating particles.

17 Claims, 12 Drawing Sheets

(51) Int. Cl.
  *B81B 7/00* (2006.01)
  *B81C 1/00* (2006.01)
  *H04R 31/00* (2006.01)
  *H04R 1/08* (2006.01)
  *H04R 1/28* (2006.01)

(52) U.S. Cl.
  CPC ......... *B81C 1/00626* (2013.01); *H04R 1/086* (2013.01); *H04R 1/2807* (2013.01); *H04R 19/005* (2013.01); *H04R 31/00* (2013.01); *B81B 2201/0257* (2013.01); *B81B 2203/0127* (2013.01); *B81B 2207/012* (2013.01); *B81C 2201/014* (2013.01); *B81C 2201/0198* (2013.01); *H04R 2201/003* (2013.01)

(58) Field of Classification Search
  CPC ............ H04R 2201/003; B81B 7/0029; B81B 2203/0127; B81B 2201/0257; B81B 2207/012; B81C 1/00309; B81C 2201/014; B81C 1/00626; B81C 2201/0198
  See application file for complete search history.

(56) References Cited

U.S. PATENT DOCUMENTS

| | | | |
|---|---|---|---|
| 5,467,252 | A | 11/1995 | Nomi et al. |
| 5,591,679 | A | 1/1997 | Jakobsen et al. |
| 5,869,749 | A | 2/1999 | Bonne et al. |
| 5,889,872 | A | 3/1999 | Sooriakumar et al. |
| 6,088,463 | A | 7/2000 | Rombach et al. |
| 6,437,412 | B1 | 8/2002 | Higuchi et al. |
| 6,522,762 | B1 | 2/2003 | Mullenborn et al. |
| 6,541,832 | B2 | 4/2003 | Coyle |
| 6,732,588 | B1 | 5/2004 | Mullenborn et al. |
| 6,781,231 | B2 | 8/2004 | Minervini |
| 7,436,054 | B2 | 10/2008 | Zhe |
| 7,763,488 | B2 | 7/2010 | Goodelle et al. |
| 8,049,287 | B2 | 11/2011 | Combi et al. |
| 8,421,168 | B2 | 4/2013 | Allen et al. |
| 8,433,084 | B2 | 4/2013 | Conti et al. |
| 8,629,011 | B2 | 1/2014 | Diamond et al. |
| 9,096,424 | B2 | 8/2015 | Conti et al. |
| 2002/0119807 | A1 | 8/2002 | Lee et al. |
| 2004/0099918 | A1 | 5/2004 | Noguchi et al. |
| 2005/0006738 | A1 | 1/2005 | Schaper et al. |
| 2007/0040231 | A1 | 2/2007 | Harney et al. |
| 2009/0101998 | A1 | 4/2009 | Yen et al. |
| 2010/0164083 | A1 | 7/2010 | Yim |
| 2010/0284553 | A1 | 11/2010 | Conti et al. |
| 2012/0237073 | A1 | 9/2012 | Goida et al. |
| 2013/0221457 | A1 | 8/2013 | Conti et al. |
| 2016/0261941 | A1 | 9/2016 | Brioschi et al. |
| 2016/0345084 | A1* | 11/2016 | Friza ..................... H04R 1/086 |
| 2018/0215609 | A1 | 8/2018 | Agashe et al. |
| 2020/0148531 | A1 | 5/2020 | Wiesbauer et al. |

FOREIGN PATENT DOCUMENTS

| | | |
|---|---|---|
| CN | 1441127 A | 9/2003 |
| CN | 1445536 A | 10/2003 |
| CN | 1544901 A | 11/2004 |
| CN | 104640038 A | 5/2015 |
| CN | 205179362 U | 4/2016 |
| CN | 105939506 A | 9/2016 |
| CN | 106167246 A | 11/2016 |
| CN | 206472304 U | 9/2017 |
| EP | 1577656 A1 | 9/2005 |
| EP | 1684079 A9 | 7/2006 |
| EP | 2252077 A1 | 11/2010 |
| EP | 2536168 A2 | 12/2012 |
| JP | 7-225240 A | 8/1995 |
| JP | 9-304211 A | 11/1997 |
| JP | 11111878 A | 4/1999 |
| JP | 2003-163998 A | 6/2003 |
| JP | 2005-180930 A | 7/2005 |
| JP | 5043297 B2 | 10/2012 |
| WO | 2004/068094 A2 | 8/2004 |
| WO | 2007/112743 A | 10/2007 |

* cited by examiner

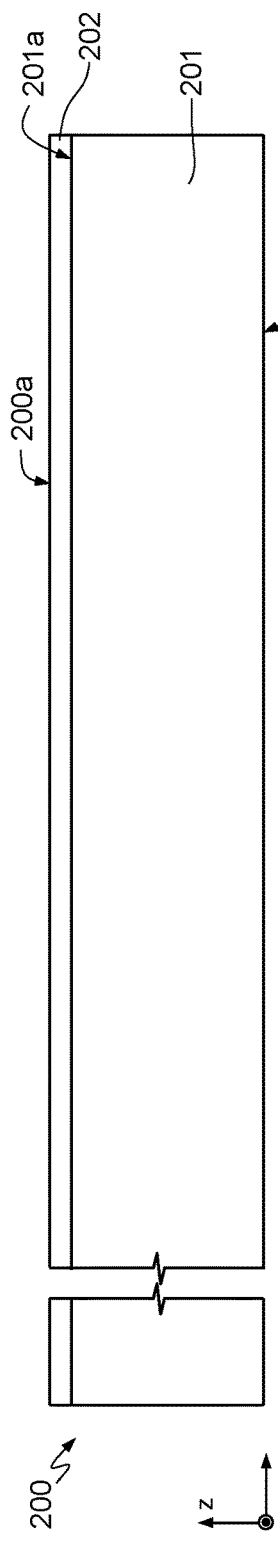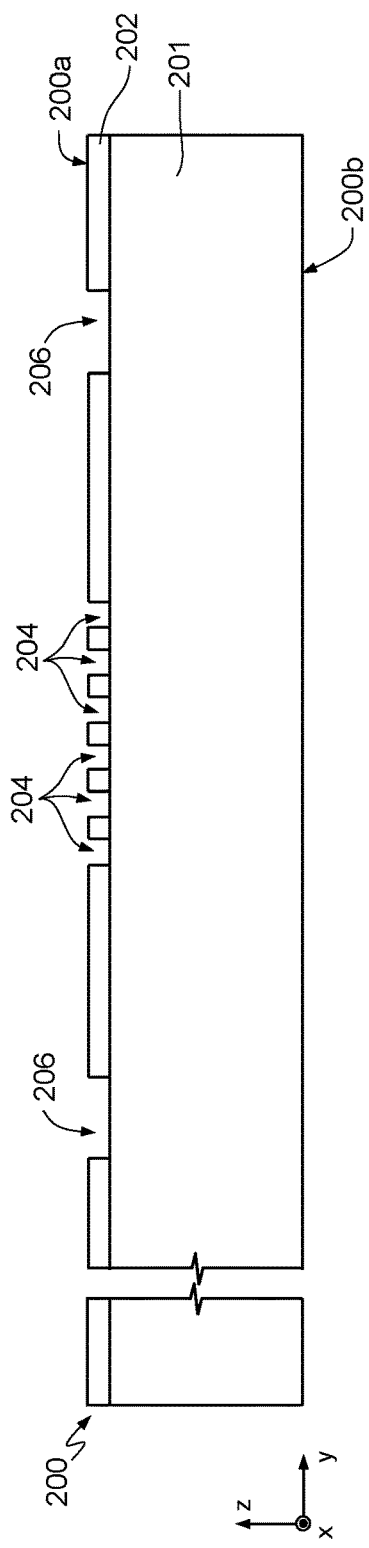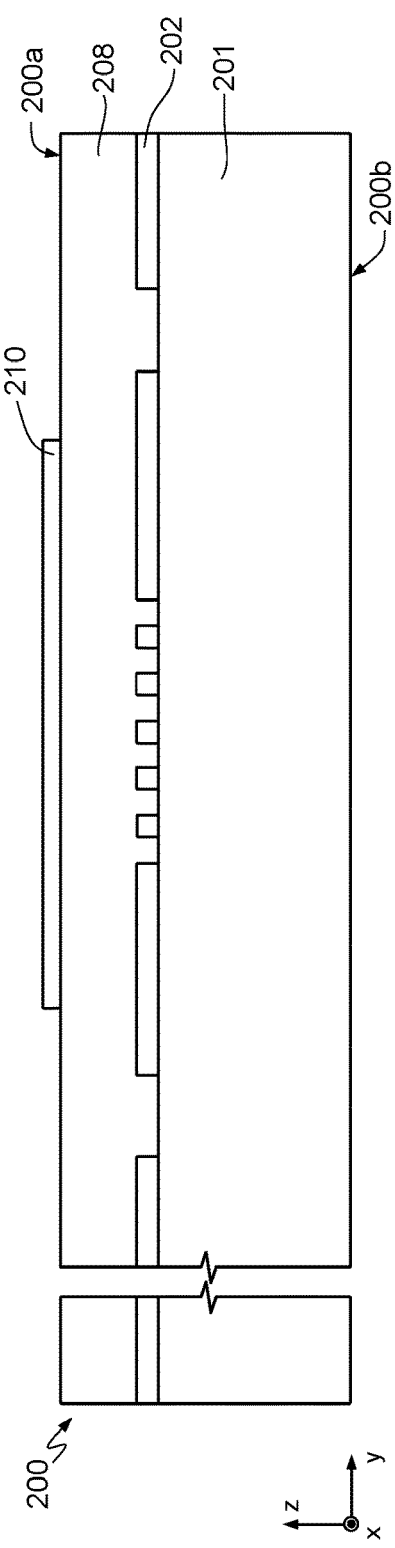

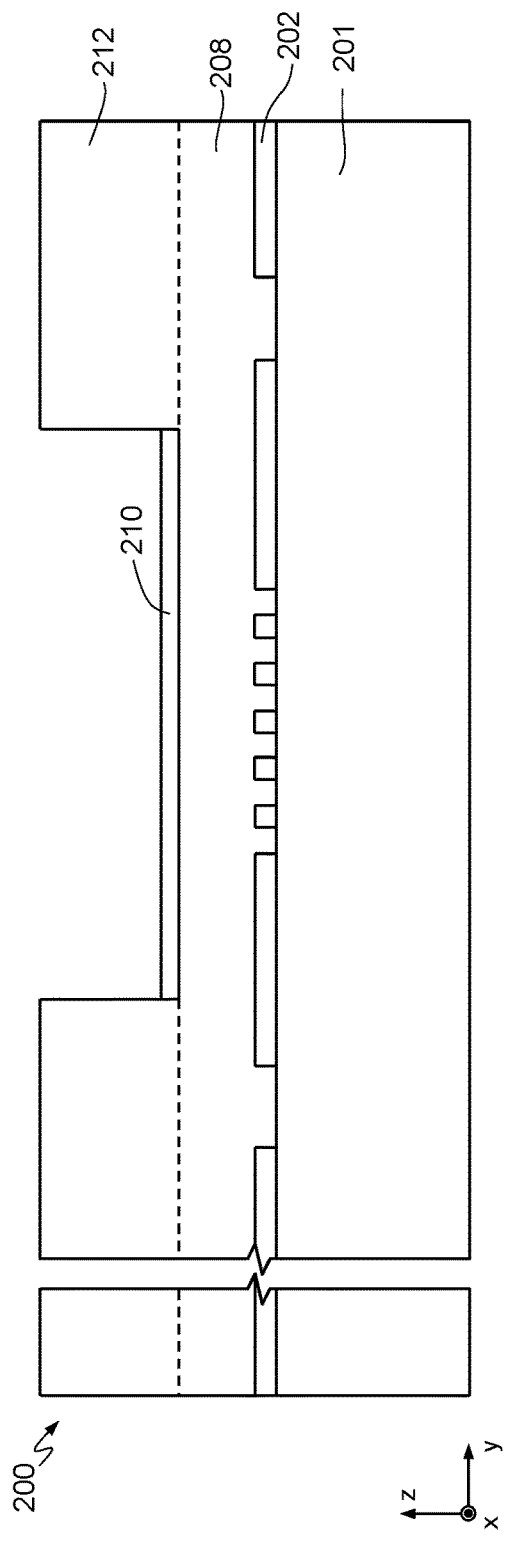
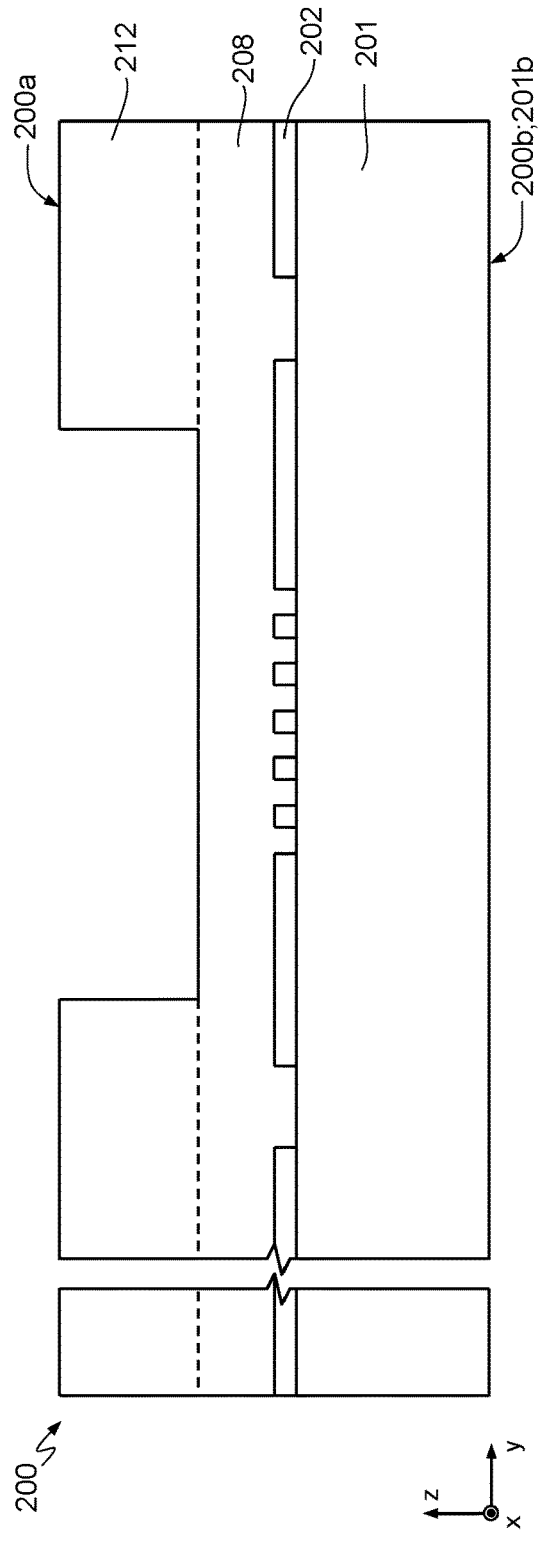

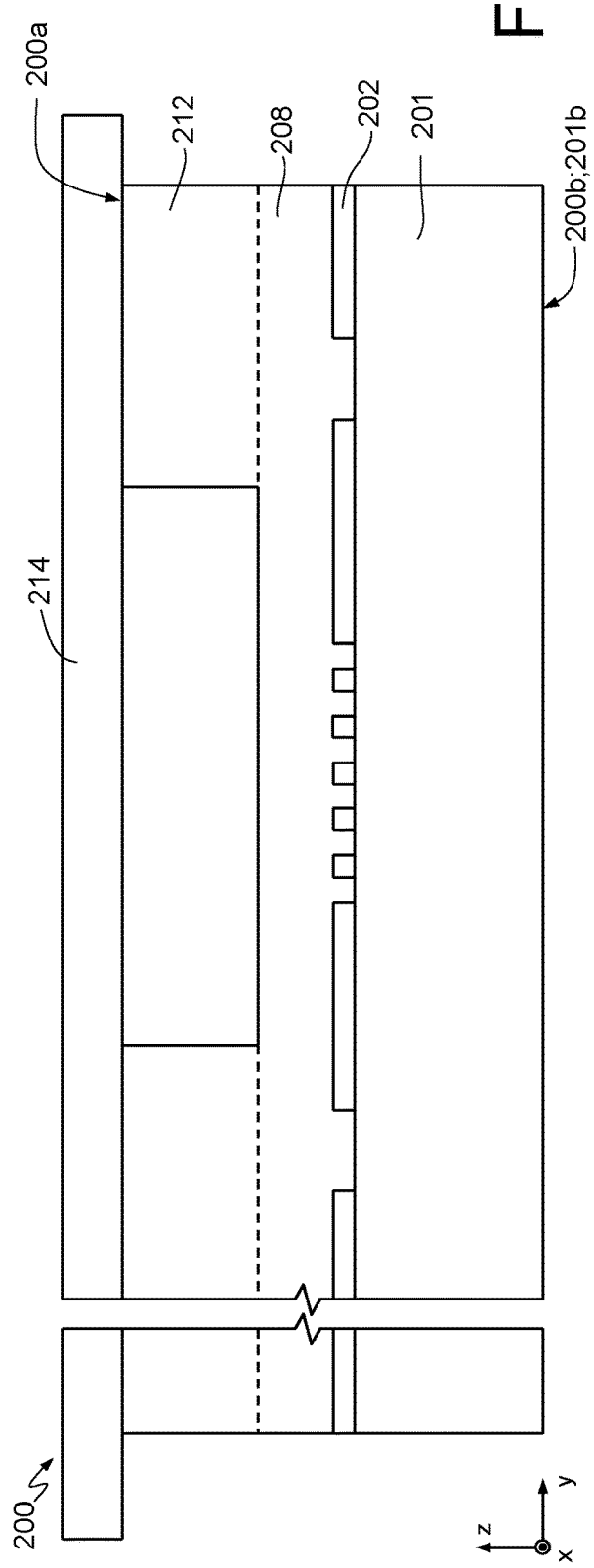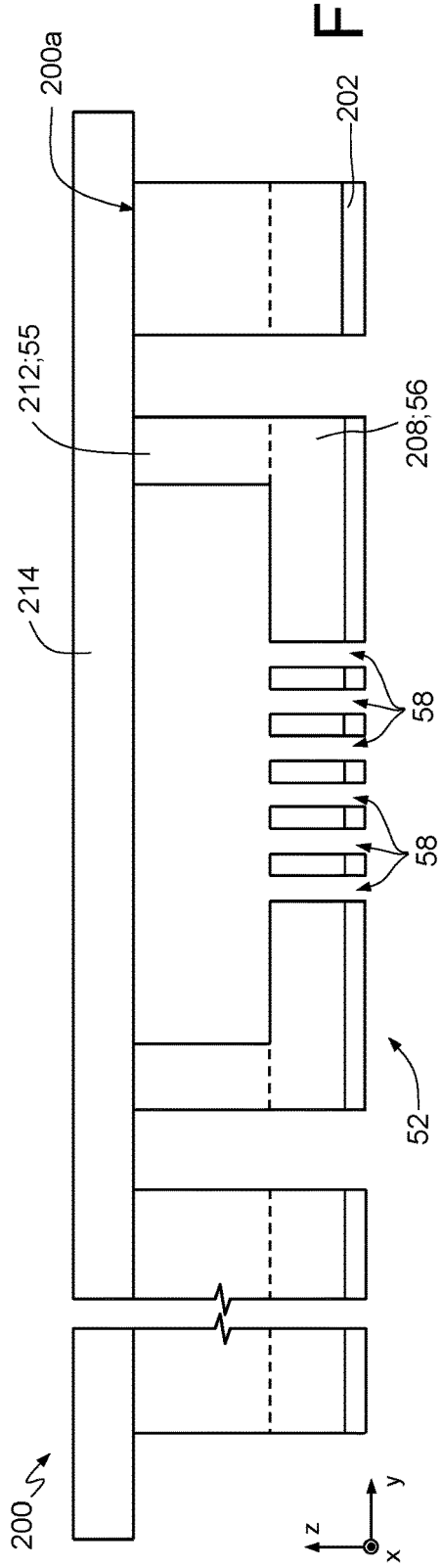

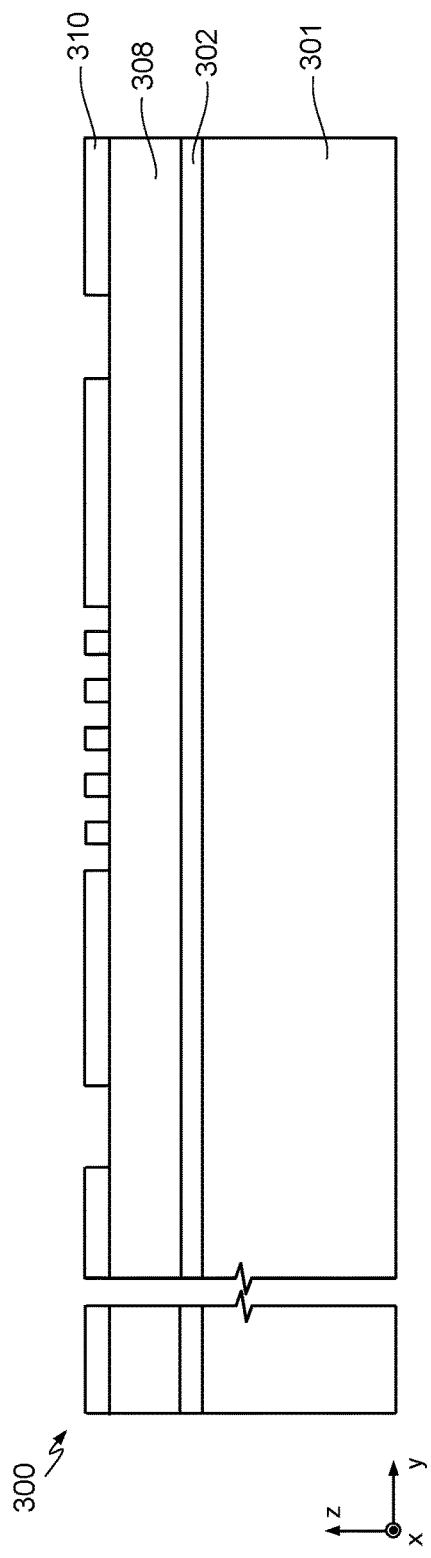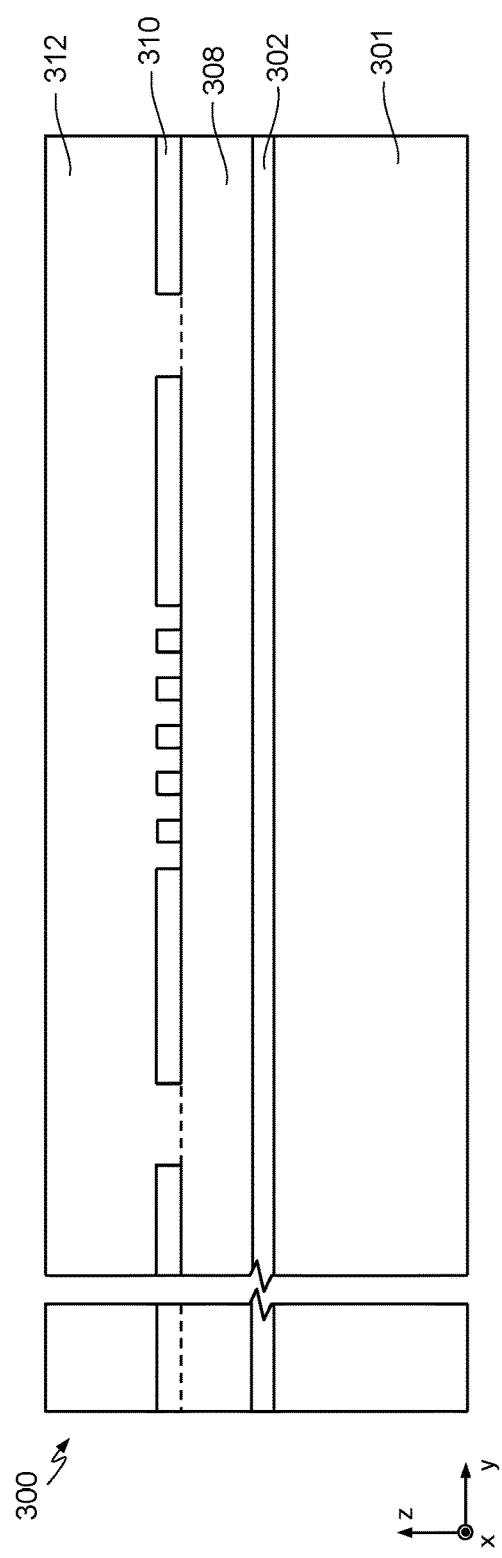

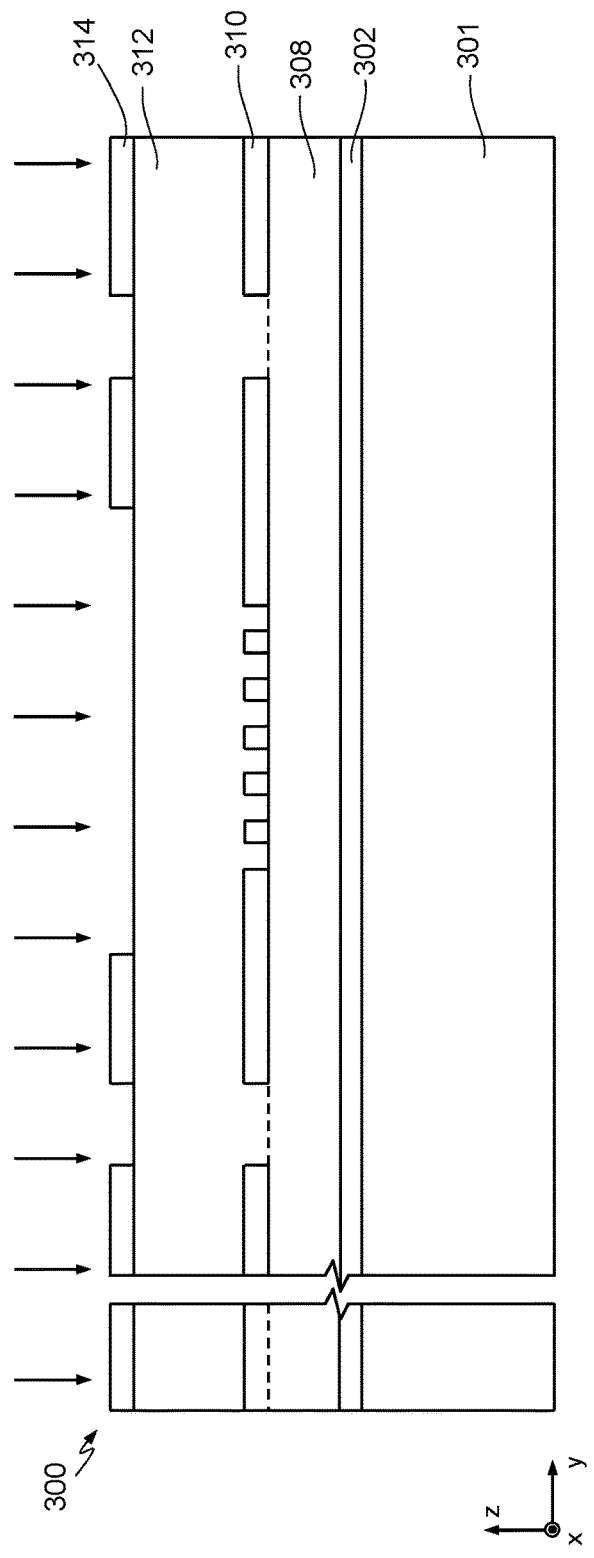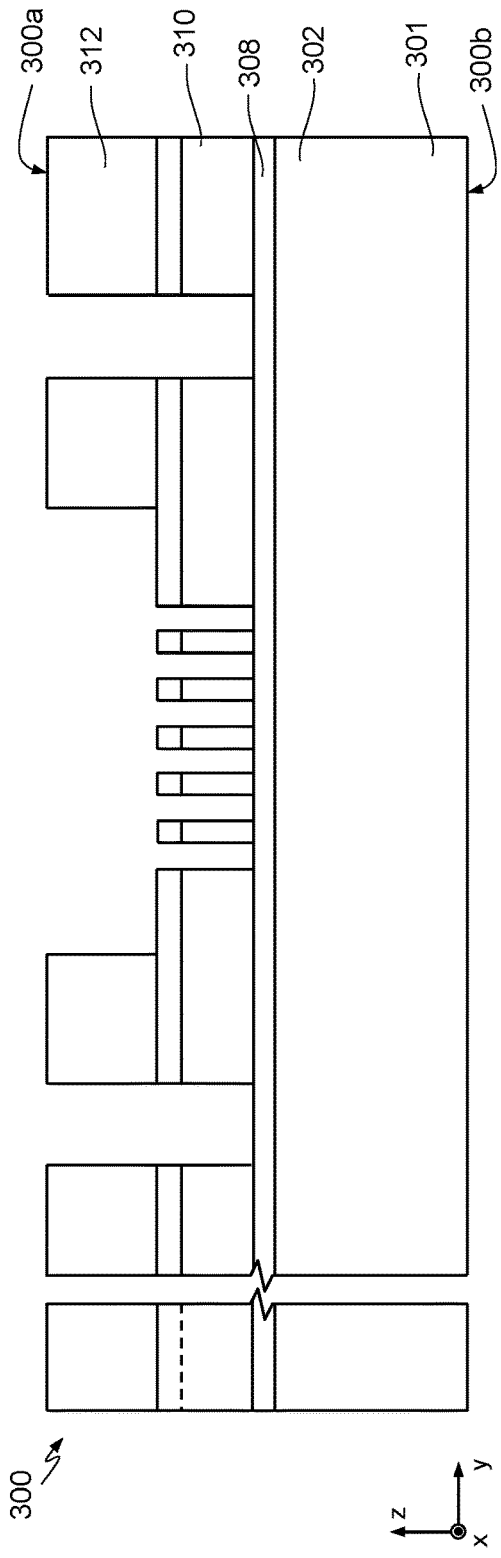

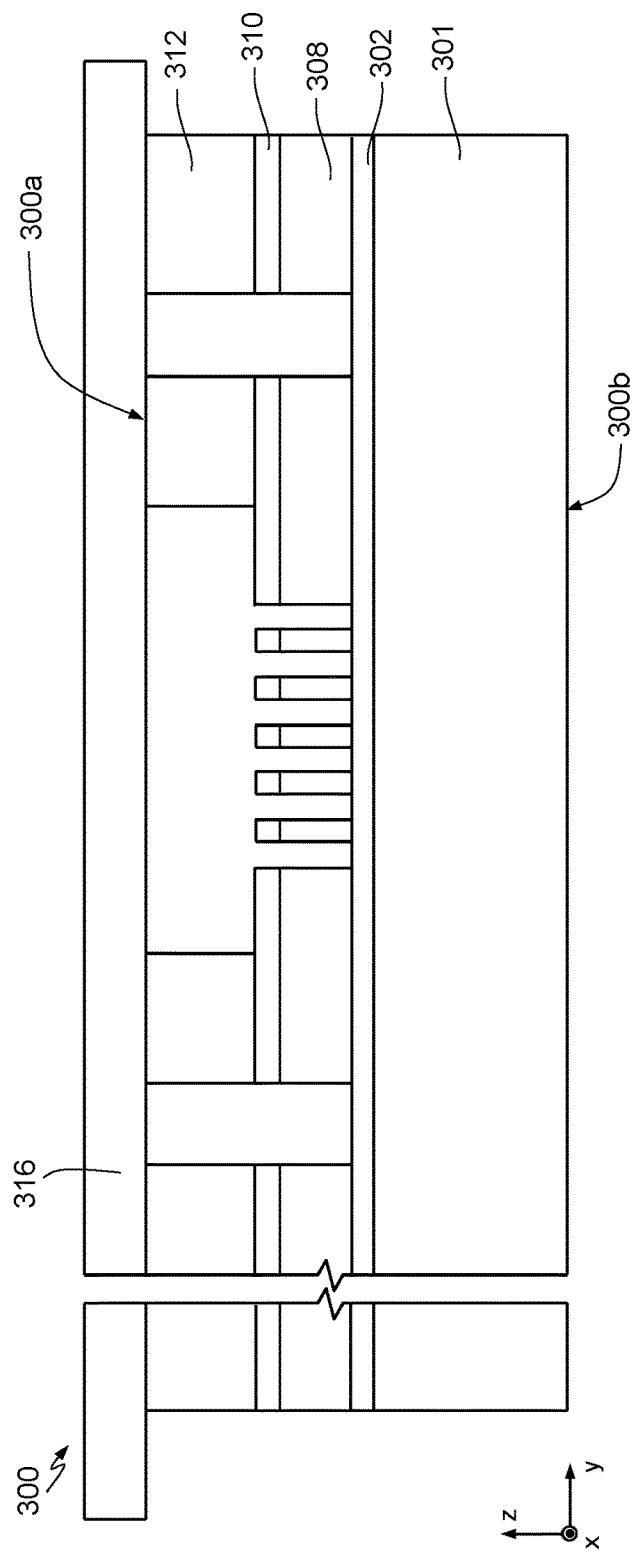
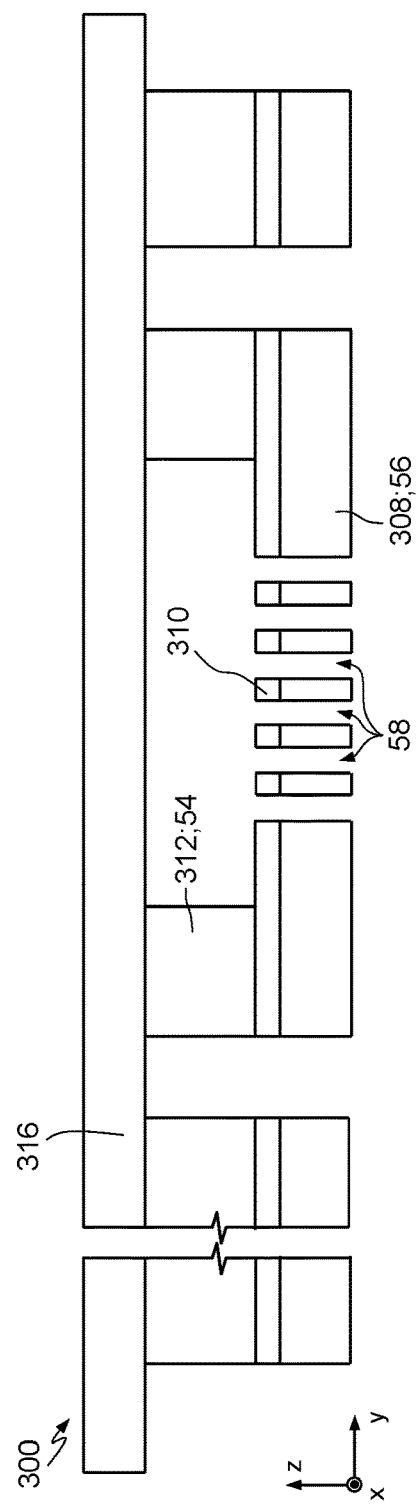

METHOD FOR MANUFACTURING A THIN FILTERING MEMBRANE AND AN ACOUSTIC TRANSDUCER DEVICE INCLUDING THE FILTERING MEMBRANE

BACKGROUND

Technical Field

The present disclosure relates to a method for manufacturing a filtering membrane, an acoustic transducer device including the filtering membrane, a method for assembling the acoustic transducer device, and an electronic system including the acoustic transducer device.

Description of the Related Art

In a known way, an acoustic transducer (in particular, a microphone) of a MEMS (Micro-Electro-Mechanical System) type comprises a sensitive membrane structure designed to transduce sound pressure waves into an electrical quantity (e.g., a capacitive variation), and a read electronics designed to perform appropriate operations of processing (amongst which operations of amplification and filtering) of said electrical quantity so as to supply an electrical output signal (e.g., a voltage) representing the acoustic pressure wave received. In the case where a capacitive sensing principle is used, the microelectromechanical sensitive structure in general comprises a mobile electrode, obtained as a diaphragm or membrane, arranged facing a fixed electrode, to provide the plates of a sensing capacitor with variable capacitance. The mobile electrode is anchored by its first portion, which is generally perimetral, to a structural layer, whereas a second portion of the mobile electrode, which is generally central, is free to move or bend in response to the pressure exerted by the incident sound pressure waves. The mobile electrode and the fixed electrode thus form a capacitor, and bending of the membrane that constitutes the mobile electrode causes a variation of capacitance as a function of the acoustic signal to be detected.

Illustrated in FIG. 1 is an acoustic transducer device 19, represented in a triaxial system of co-ordinates x, y, z. The acoustic transducer device 19 comprises a first die 21, which integrates a MEMS structure 1, in particular a MEMS acoustic transducer (microphone), provided with a membrane 2, which is mobile and of a conductive material, facing a rigid plate 3 (by this term is here meant an element that is relatively rigid with respect to the membrane 2, which is instead flexible). The rigid plate 3 includes at least one conductive layer facing the membrane 2 so that the membrane 2 and the rigid plate 3 form facing plates of a capacitor.

The membrane 2, which in use undergoes deformation as a function of incident sound pressure waves, is at least partially suspended over a structural layer 5 and directly faces a cavity 6, obtained by etching a rear surface 5b of the structural layer 5 (the rear portion 5b is opposite to a front surface 5a of the structural layer 5 itself, arranged in the proximity of the membrane 2).

The MEMS structure 1 is housed in an internal cavity 8 of a package 20, together with a further die 22, of semiconductor material, which integrates a processing circuit, or ASIC (Application-Specific Integrated Circuit) 22'. The ASIC 22' is electrically coupled to the MEMS structure 1 by an electrical conductor 25', which connects respective pads 26' of the first and second dice 21, 22. The first and second dice 21, 22 are coupled side-by-side on a substrate 23 of the package 20. The first die 21 is coupled to the substrate 23 on the rear surface 5b of the structural layer 5, for example by an adhesive layer; likewise, also the second die 22 is coupled to the substrate 23 on a rear surface 22b thereof. Provided on a front surface 22a of the second die 22, opposite to the rear surface 22b, is the ASIC 22'.

Appropriate metallization layers and vias (not illustrated in detail) are provided in the substrate 23 for routing of the electrical signals towards the outside of the package 20. Further electrical connections 25", obtained with the wire-bonding technique, are provided between pads 26" of the second die 22 and respective pads 26" of the substrate 23.

Further coupled to the substrate 23 is a covering 27 of the package 20, which encloses inside it the first and second dice 21, 22. Said covering 27 may be of metal or pre-molded plastic.

Electrical-connection elements 29, for example in the form of conductive lands, are provided on the underside of the substrate 23 (the side exposed outwards), for soldering and electrical connection to a printed-circuit board.

The substrate 23 further has a through opening, or hole, 28, which arranges in fluidic communication the cavity 6 of the first die 21 with the environment external to the package 20. The through opening 28 (in what follows referred to as "sound port") enables entry of a flow of air from outside the package 20 and of the sound pressure waves, which, by impacting on the membrane 2, cause deflection thereof.

In a known way, the sensitivity of the acoustic transducer depends upon the mechanical characteristics of the membrane 2 of the microelectromechanical structure 1 and further upon assembly of the membrane 2 and of the rigid plate 3. In addition, the volume of the acoustic chamber created by the cavity 6 has a direct effect on the acoustic performance, determining the resonance frequency of the acoustic transducer.

There are thus several constraints imposed on assembly of a MEMS acoustic transducer, which render design thereof particularly problematical, in particular where extremely compact dimensions are required, as for example in the case of portable applications.

In order to protect at least partially the cavity 6 and the membrane 2 from dust and/or water and/or other debris that might penetrate through the through opening 28, thus reducing the useful dimensions of the cavity 6 and/or forming an electrical leakage path, thus jeopardizing the performance of the acoustic transducer, it is known to provide a filter (illustrated only schematically in FIG. 1, and designated by the reference 30) outside the package 20 and facing the sound port 28 (at a distance therefrom). Said filter 30 is, for example, coupled to a protective case of a portable device (e.g., a cellphone) that houses the package 20.

In particular, in the case of portable applications, the package 20 is housed within the protective case of the portable device itself, in such a way that the sound port 28 in turn faces a respective through opening, or hole, made through the protective case of the portable device via interposition of the filter 30 itself. The filters currently used are mounted manually on the protective case of the portable device and consequently present excessive dimensions with respect to the real operating need, which is that of protecting exclusively the cavity 6, as well as, obviously, the membrane 2 and the rigid plate 3.

Furthermore, the filter 30 prevents entry of contaminating particles through the hole made through the protective case of the portable device, but does not solve the problem of contamination deriving from particles of dust or other debris coming from different sources (e.g., on account of a non-perfect hermetic closing of the protective case).

Likewise known, as described in the document EP3065416, which also published as U.S. Pat. No. 9,769,554, is the use of a filter of silicon integrated in the microelectromechanical structure 1 and above the hole 28, or a filtering module arranged between the cavity 6 and the hole 28, for example comprising a weave of wires that forms a mesh such as to define through openings of maximum size, measured along the axis x and/or the axis y, comprised between 5 and 40 µm. The latter solutions provides protection from contaminants during intermediate manufacturing and assembly steps, or else during steps of mounting of the package in the portable device. However, in both cases and in general for filters of a known type, the thickness of the filter affects the acoustic performance of the acoustic transducer 19, impacting on the signal-to-noise ratio (SNR). It is thus desirable to provide a filter for acoustic transducers of small thickness so as to minimize the impact on the signal-to-noise ratio (SNR).

BRIEF SUMMARY

One or more embodiments are directed to a method for manufacturing a filtering membrane, an acoustic transducer device including the filtering membrane, a method for assembling the acoustic transducer device, and an electronic system including the acoustic transducer device that will enable the drawbacks of the prior art to be overcome.

According to the present invention a method for manufacturing a filtering membrane, an acoustic transducer device including the filtering membrane, a method for assembling the acoustic transducer device, and an electronic system including the acoustic transducer device are provided. In particular, the filtering membrane has a limited thickness so as to present a negligible impact on the acoustic performance of the acoustic transducer device.

BRIEF DESCRIPTION OF THE SEVERAL VIEWS OF THE DRAWINGS

For a better understanding of the present invention, preferred embodiments thereof are now described, purely by way of non-limiting example, with reference to the attached drawings, wherein:

FIGS. 7A-7G show a method for manufacturing a filtering module common to the embodiments of the acoustic transducer devices of FIGS. 2, 4, and 5 and alternative to the manufacturing method of FIGS. 6A-6E;

FIGS. 8A-8F show a method for manufacturing a filtering module common to the embodiments of the acoustic transducer devices of FIGS. 2, 4, and 5 and alternative to the manufacturing method of FIGS. 6A-6E.

DETAILED DESCRIPTION

Figure 1:
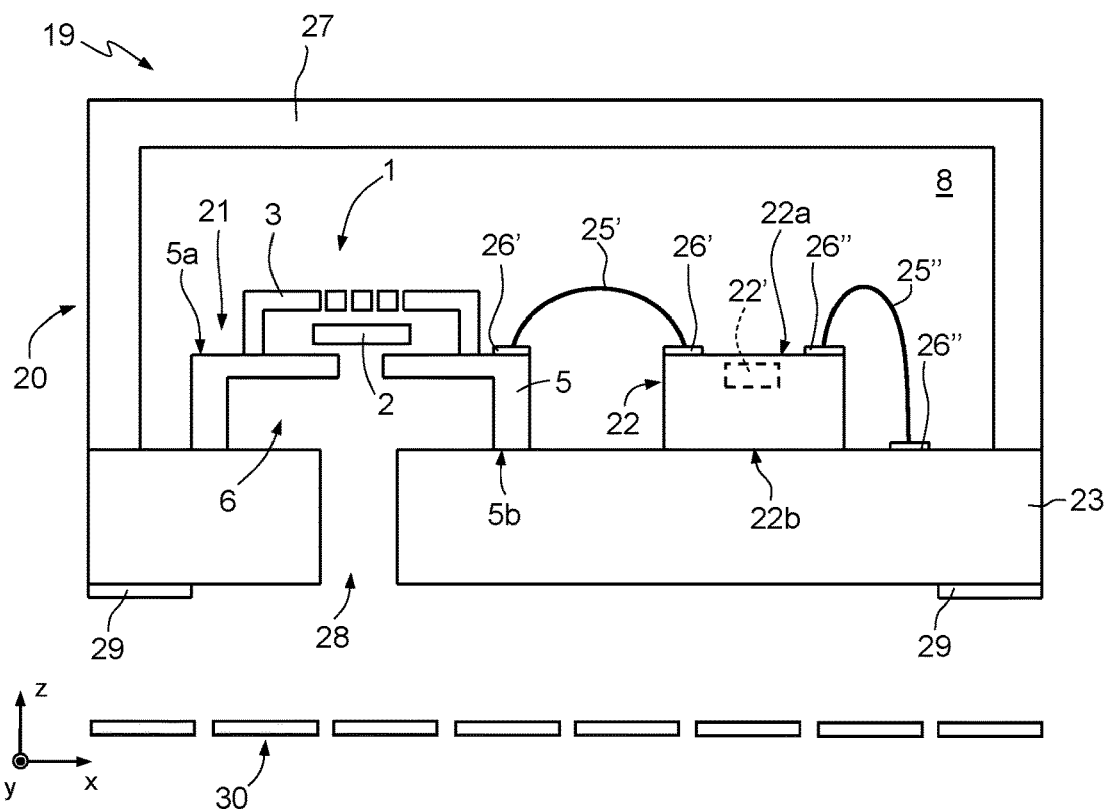
FIG. 1 is a schematic cross-sectional view of an acoustic transducer device including a MEMS acoustic transducer with the corresponding package, according to an embodiment of a known type.
Figure 2:
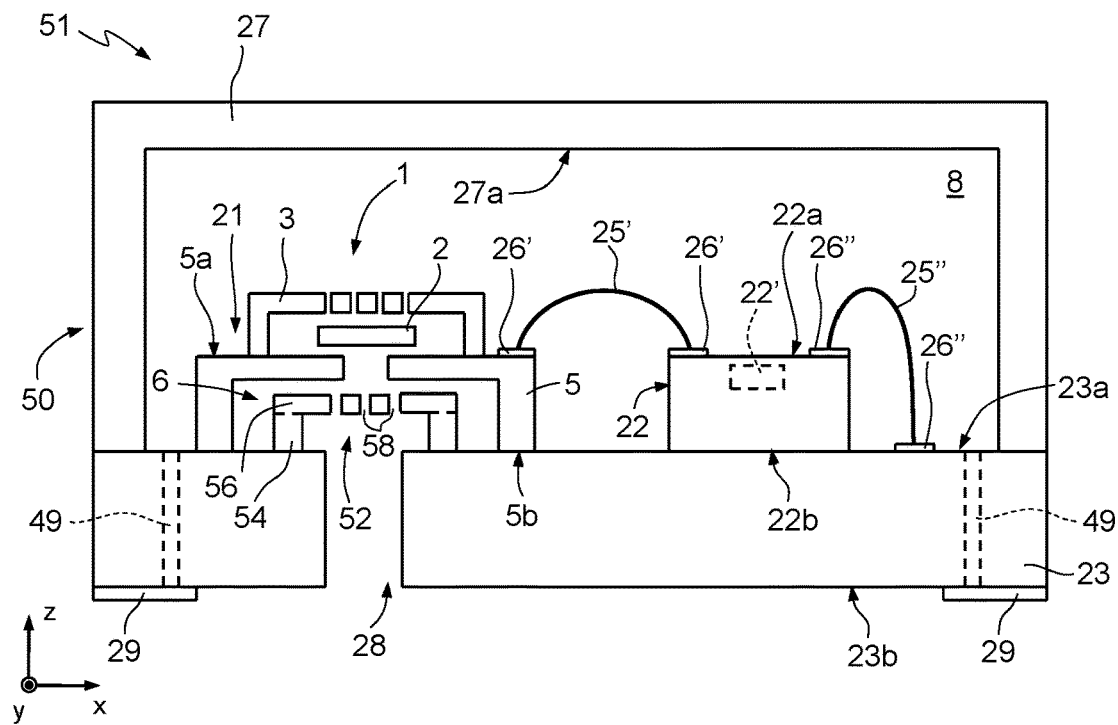
FIG. 2 is a schematic cross-sectional view of an acoustic transducer device including a MEMS acoustic transducer with the corresponding package and a filtering module, according to an embodiment of the present invention.

FIG. 2 shows, in cross-sectional view, an acoustic transducer device 51 according to an aspect of the present invention. Elements that are in common with the acoustic transducer device 51 of FIG. 2 and the acoustic transducer device 19 of FIG. 1 are designated by the same reference numbers and are not described any further.

In greater detail, the acoustic transducer device 51 of FIG. 2 includes a package 50, formed by the base substrate 23 and by the covering element 27. The latter has a substantially cup-like conformation, and is coupled to the base substrate 23 to form the cavity, or inner space, 8 of the package 50. Provided right through the thickness of the base substrate 23 is the through opening 28, designed to arrange in acoustic communication the cavity 6 of the first die 21 with the environment external to the package 50. In what follows, the through opening 28 will also be referred to as "sound port", and the cavity 6 of the first die 21 will also be referred to as "acoustic chamber". Further, the term "acoustic communication" is here used with the meaning of "direct acoustic communication", in the sense that generic sound waves, or acoustic pressure waves, propagate in the environment considered using as sole propagation medium air (or a possible gas, or mixture of gases, equivalent from the standpoint of acoustic propagation).

The extension (in the horizontal plane xy) of the acoustic chamber 6 is greater than the corresponding extension (once again in the horizontal plane xy) of the sound port 28 in such a way that the sound port 28 communicates entirely with the acoustic chamber 6 without having a direct outlet into the inner space 8 of the package 50.

According to an aspect of the present disclosure, the acoustic chamber 6 of the first die 21 is in acoustic communication with the sound port 28 exclusively through a filtering module 52, which is arranged between the sound port 28 and the acoustic chamber 6 of the first die 21. For instance, the filtering module 52 may be arranged inside the acoustic chamber 6. The filtering module 52 comprises a supporting layer 54 and a filtering layer 56, which is arranged on the supporting layer 54. The extension (in the horizontal plane xy) of the supporting layer 54 is greater than the corresponding extension (once again in the horizontal plane xy) of the sound port 28 in such a way that the sound port 28 is entirely surrounded by the supporting layer 54.

Thus, the filtering module 52 creates an obstacle to the passage of dust and/or contaminating particles coming from the environment external to the package 50, towards the acoustic chamber 6.

According to one aspect of the present invention, the filtering layer 56 has a thickness comprised, for example, between 1 µm and 10 µm, in particular 5 µm, and has a plurality of through openings such that the flow of sound waves is not interrupted or sensibly degraded by the presence of the filtering module 52. The impact on the signal-to-noise ratio of the acoustic transducer device 51 is thus minimized, and the acoustic communication of the acoustic chamber 6 towards the outside of the package 50 is provided. The supporting layer 54 has a thickness comprised between 30 µm and 120 µm, in particular 50 µm. Consequently, the filtering module 52 has a total thickness comprised between 51 µm and 130 µm, in particular 55 µm.

The filtering module 52 may be of any material compatible with the processes for manufacturing semiconductor devices. In particular, the supporting layer 54 may be of metal material, insulating material (e.g., silicon dioxide or silicon nitride), or semiconductor material (e.g., silicon, polysilicon, or epitaxial silicon). Further, as described in greater detail hereinafter, the filtering layer 56 may be of polysilicon grown epitaxially or any other method of growing polysilicon. Alternatively, the filtering layer 56 may be of any other material compatible with the processes for manufacturing semiconductor devices that may be deposited for a thickness of a few micrometers.

The base substrate 23 is, for example, constituted by a multi-layered structure, made up of one or more layers of conductive material (generally metal) separated by one or more dielectric layers (e.g., of a BT—Bismaleimide Triazine—laminate). Electrical paths 49 are provided through the base substrate 23 for connecting an inner surface 23a thereof, facing the inner space 8, to an outer surface 23b thereof, facing the external environment, which supports the electrical-connection elements 29. The latter are provided, in particular, in the form of lands, in the case of so-called LGA (Land-Grid Array) packages, as illustrated in FIG. 2. Alternatively, the pads 29 may be replaced by an array of balls or bumps, obtaining a so-called BGA (Ball-Grid Array) package.

According to a different embodiment, the base substrate 23 does not comprise metal layers or layers of conductive material in general and is made, for example, of plastic material.

Also the covering element 27 may be constituted by a multilayer, for example including one or more plastic and/or metal layers, and may advantageously present a metal coating (not illustrated) on an inner surface 27a thereof, facing the inner space 8, in order to provide an electromagnetic shield. Alternatively, the covering element 27 is completely of metal.

The covering element 27 is further coupled to the base substrate 23 so as to seal the inner space 8 hermetically.

Figure 3A:
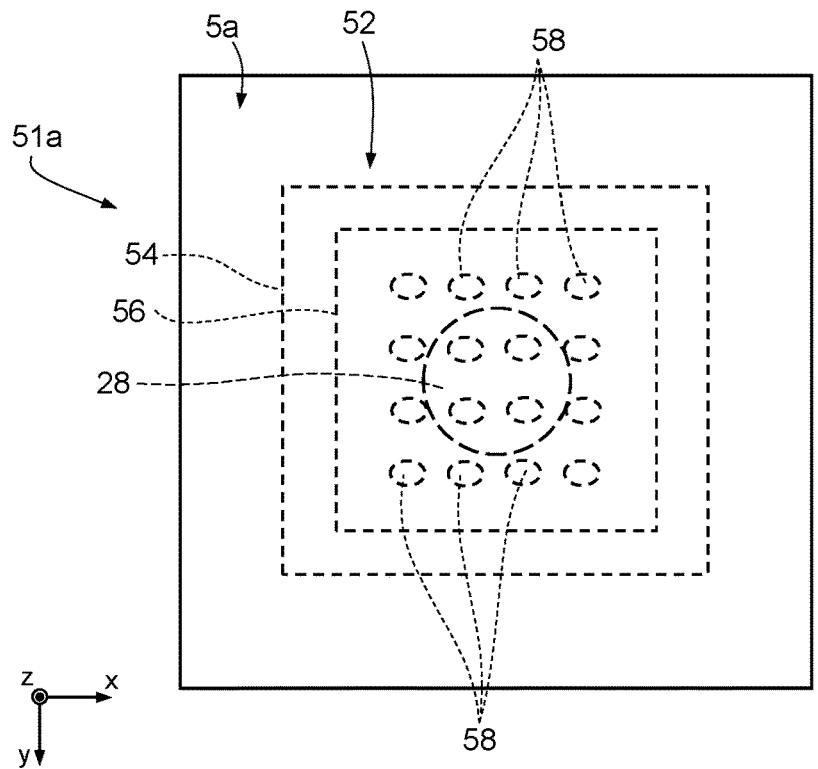
FIGS. 3A and 3B are top plan views of a portion of the acoustic transducer device of FIG. 2, according to respective embodiments.

FIG. 3A is a schematic top plan view of a portion of the acoustic transducer device 51. In particular, FIG. 3A presents the arrangement of the filtering module 52 with respect to the structural layer 5. The supporting layer 54 and the filtering layer 56 have a parallelepipedal shape. Further, the supporting layer 54 has a cavity, for example with polygonal cross-section, which extends throughout the thickness of the supporting layer 54. Further, as has been said, the filtering layer 56 has a plurality of through openings 58, for example with circular section having a diameter comprised between 1 µm and 10 µm, in particular 5 µm. In other embodiments, the through openings 58 may have a polygonal cross-section of dimensions such that a circumference inscribed in the polygon will have a diameter comprised in the same range specified for the aforementioned circular section. Consequently, the filtering layer 56 prevents passage of contaminating particles having a size larger than the aforesaid diameter.

The through openings 58 may be arranged in an array configuration, in which through openings 58 adjacent to one another are at a distance from one another (measured in the horizontal plane xy between the respective centroids) comprised between 3 µm and 15 µm, in particular 7 µm. In other embodiments, the through openings 58 may be arranged in an irregular way.

The through openings 58 may extend in a central region of the filtering layer 56, substantially aligned in top plan view to the through opening 28, and/or in a peripheral region of the filtering layer 56, arranged in top plan view between the through opening 28 and the supporting layer 54.

In general, the number of through openings 58 is selected so as to maximize the ratio between the sum of the areas (measured in the horizontal plane xy) of the through openings 58 and the area of the suspended portion of the filtering layer 56 (measured in the horizontal plane xy limitedly to the regions of the filtering layer 56, which extend around the through openings 58, i.e., the solid parts of the filtering layer 56). For instance, the ratio between the sum of the areas of the through openings 58 and the area of the suspended portion of the filtering layer 56 is comprised between 0.3 and 0.7, in particular 0.45. Said ratio coincides with the ratio between the sum of the volumes of the through openings 58 and the volume of the remaining suspended portions of the filtering layer 56.

Figure 3B:
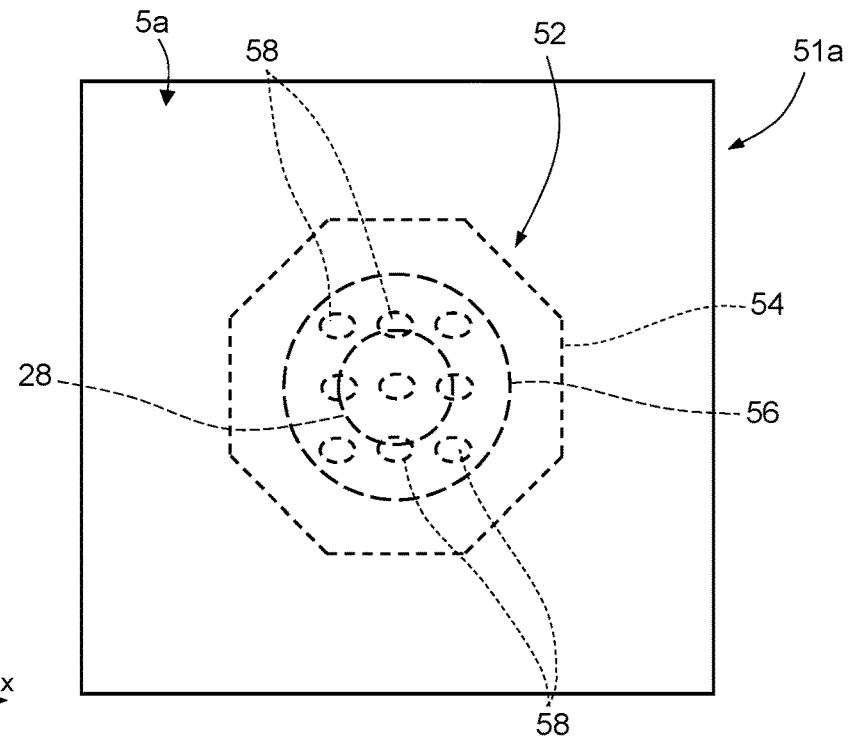

FIG. 3B is a schematic top plan view of a portion of the acoustic transducer device 51a according to an embodiment of the present invention alternative to that of FIG. 3A.

In the acoustic transducer device 51a of FIG. 3B, the supporting layer 54 is shaped like a prism with a polygonal base, for example octagonal, and has a cavity with circular section, which extends throughout the thickness of the supporting layer 54. The filtering layer 56 also has the shape of a prism with a polygonal base, for example octagonal.

In a way not illustrated in the figure, a first bonding layer extends between the inner surface 23a of the base substrate 23 and the first die 21, and a second bonding layer extends between the inner surface 23a of the base substrate 23 and the filtering module 52. In one embodiment, the first and second bonding layers coincide and form a single bonding layer, obtained, for example, by applying preferably non-conductive glue. A further respective bonding layer (made, for example, of preferably non-conductive glue or biadhesive tape) extends, in a way not illustrated in the figure, between the inner surface 23a of the base substrate 23 and the second die 22.

Figure 4:
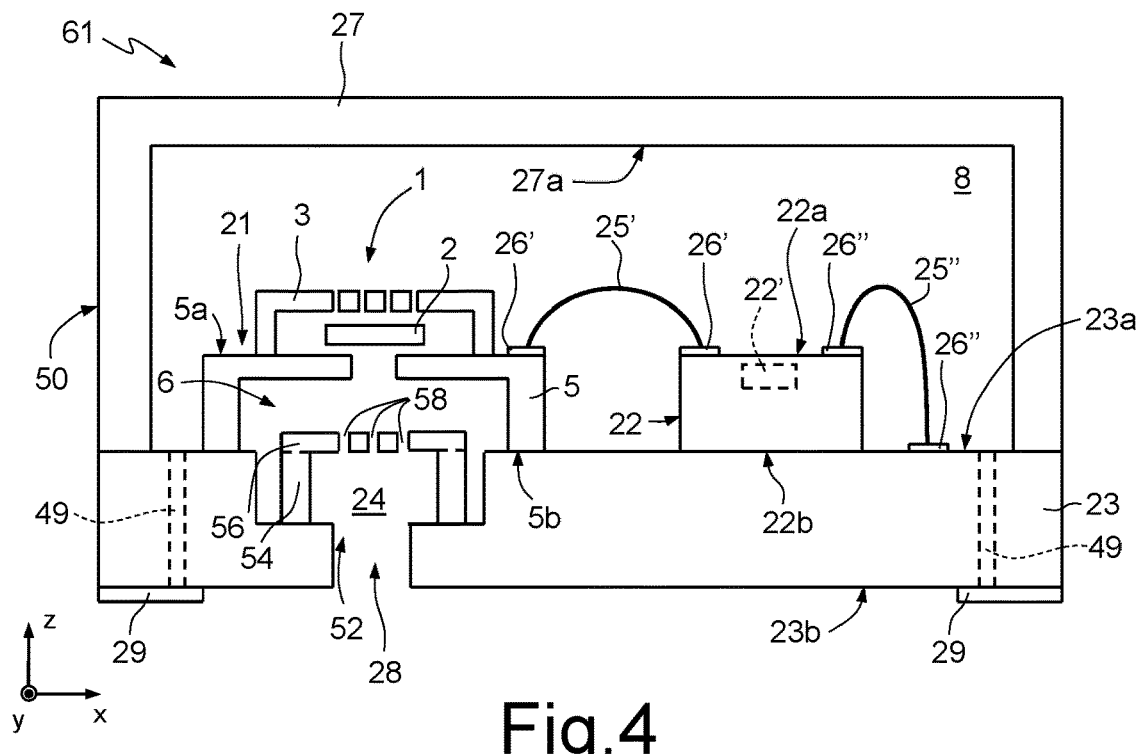
FIG. 4 is a schematic cross-sectional view of an acoustic transducer device including a MEMS acoustic transducer with the corresponding package and a filtering module, according to another embodiment of the present invention.

FIG. 4 shows, in cross-sectional view, an acoustic transducer device 61 according to a further embodiment of the present invention. Elements that are in common to the acoustic transducer device 61 of FIG. 4 and to the acoustic transducer device 51 of FIG. 2 are designated by the same reference numbers, and are not described any further. In greater detail, in the acoustic transducer device 61 of FIG. 4 the base substrate 23 has a recess 24, on its inner surface 23a, having an extension (measured in the horizontal plane xy) greater than that of the sound port 28 and smaller than that of the acoustic chamber 6 so as to surround entirely, in top plan view, the sound port 28, and being surrounded entirely, in top plan view, by the acoustic chamber 6. The recess 24 extends from the inner surface 23a towards the outer surface 23b of the base support 23 for a distance (measured along the axis z) for example comprised between 10 µm and 100 µm, in particular 40 µm.

In the acoustic transducer device 61, the filtering module 52 is housed at least partially by the recess 24. In this way, the overall thickness of the filtering module 52 is only partially constrained by the thickness of the acoustic cavity 6.

In a way not illustrated in the figure, a first bonding layer extends between the inner surface 23a of the base substrate 23 and the first die 21, and a second bonding layer extends between the inner surface 23a of the base substrate 23 in the recess 24 and the filtering module 52. The first and second bonding layers are obtained, for example, by applying preferably non-conductive glue or, alternatively, a biadhesive tape. A further respective bonding layer (which is also, for example, preferably of non-conductive glue or biadhesive tape) extends, in a way not illustrated in the figure, between the inner surface 23a of the base substrate 23 and the second die 22.

Figure 5:
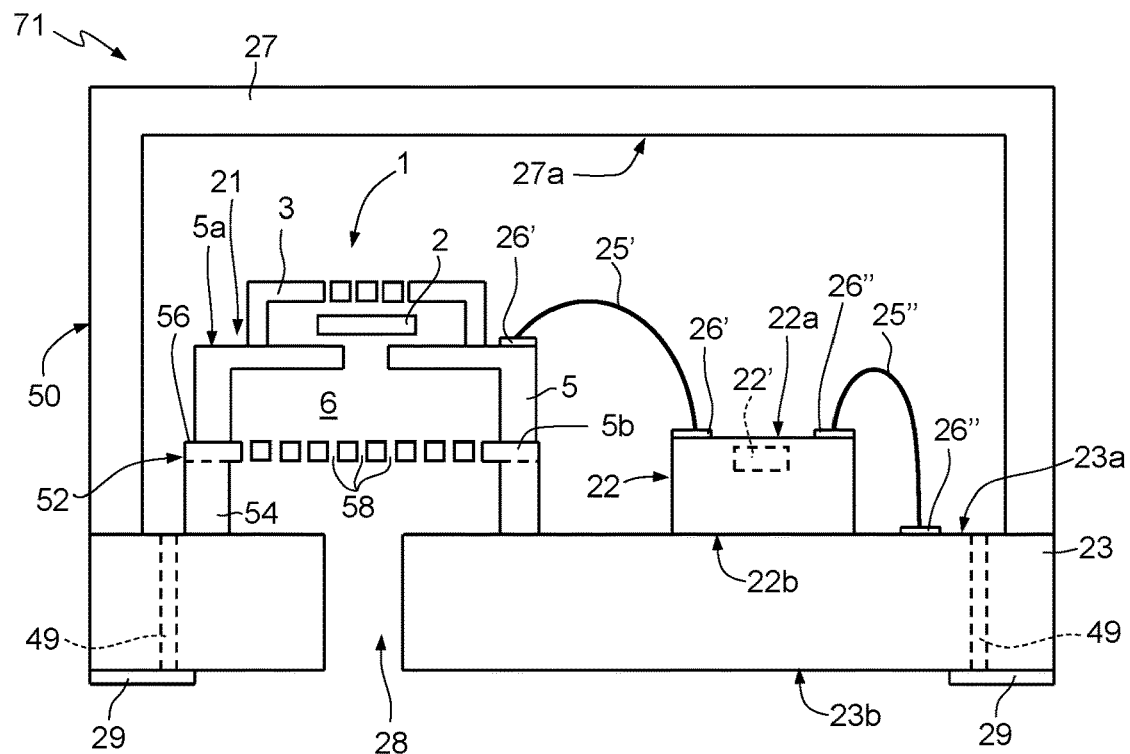
FIG. 5 is a schematic cross-sectional view of an acoustic transducer device including a MEMS acoustic transducer with the corresponding package and a filtering module, according to a further embodiment of the present invention.

FIG. 5 shows, in cross-sectional view, an acoustic transducer device 71 according to a further embodiment of the present invention. In the acoustic transducer device 71 of FIG. 5, the filtering module 52 is arranged on the inner surface 23a of the base substrate 23 in such a way that the cavity of the supporting layer 54 surrounds entirely, in top plan view, the sound port 28. Further, the first die 21 is arranged on the filtering module 52 to form a stack. Also in this embodiment, the acoustic chamber 6 is in fluid connection with the sound port 28 via the through openings of the filtering layer 56, and in particular in such a way that the sound waves entering from the sound port 28 present a preferential passage, towards the acoustic chamber 6, through the through openings of the filtering layer 56.

In a way not illustrated in the figure, a first bonding layer extends between the inner surface 23a of the base substrate 23 and the filtering module 52, and a second bonding layer extends between the first die 21 and peripheral regions of the filtering layer 56, at a distance from the through openings 58. The first and second bonding layers are obtained, for example, by applying preferably non-conductive glue. A further respective bonding layer (which is also, for example, preferably of non-conductive glue or biadhesive tape) extends, in a way not illustrated in the figure, between the inner surface 23a of the base substrate 23 and the second die 22.

In an embodiment, the thickness of the package 50 of the acoustic transducer device 71 may be greater than that of the acoustic transducer device 51 of FIG. 2 and of the acoustic transducer device 61 of FIG. 4, on the basis of the additional thickness of the filtering module 52. In another embodiment, in which the thickness of the supporting layer 54 is minimized (e.g., using a manufacturing process described in detail hereinafter with reference to FIGS. 7A-7G), the impact of the presence of the filtering module 52 on the choice of the thickness of the package 50 is negligible.

The acoustic transducer device 71 of FIG. 5 prevents degradation of the acoustic performance of the microphone 1 that might present in the acoustic transducer device 51 of FIG. 2 and in the acoustic transducer device 61 of FIG. 4, since the vacuum regions in the filtering layer 56 here have a more extensive total area, and associated to this is a lower generation of noise.

FIGS. 6A-6E show a process for manufacturing the filtering module 52, common to the acoustic transducer device 51 of FIG. 2, to the acoustic transducer device 61 of FIG. 4, and to the acoustic transducer device 71 of FIG. 5.

Figure 6A:
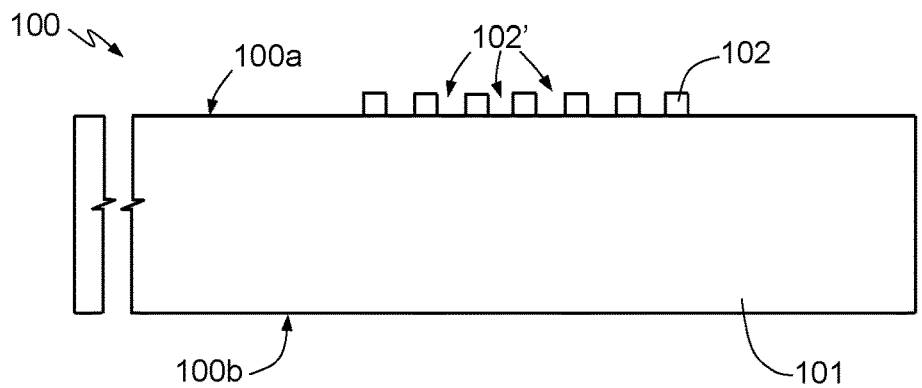
FIGS. 6A-6E show a method for manufacturing a filtering module common to the embodiments of the acoustic transducer devices of FIGS. 2, 4, and 5.

With reference to FIG. 6A, a wafer 100 is provided, which includes a substrate 101 of semiconductor material, such as silicon, which extends between a front surface 100a and a rear surface 100b of the wafer 100 for a thickness comprised, for example, between 500 μm and 1000 μm. An oxide layer 102 is formed on the front surface 100a of the wafer 100, having the function of etching mask for subsequent steps of the manufacturing process. In particular, the oxide layer 102 has a plurality of openings 102' in the regions of the wafer 100 in which the through openings 58 of the filtering layer 56 will be formed, in order to provide through openings 58 that have a desired shape, as discussed previously. The oxide layer 102 consists, for example, of silicon oxide ($SiO_2$) having a thickness comprised between 0.5 μm and 3 μm. The oxide layer 102 is formed, for example, by a step of deposition of silicon oxide and/or thermal growth of silicon oxide. The openings 102' of the oxide layer 102 are formed using known photolithographic techniques.

Figure 6B:
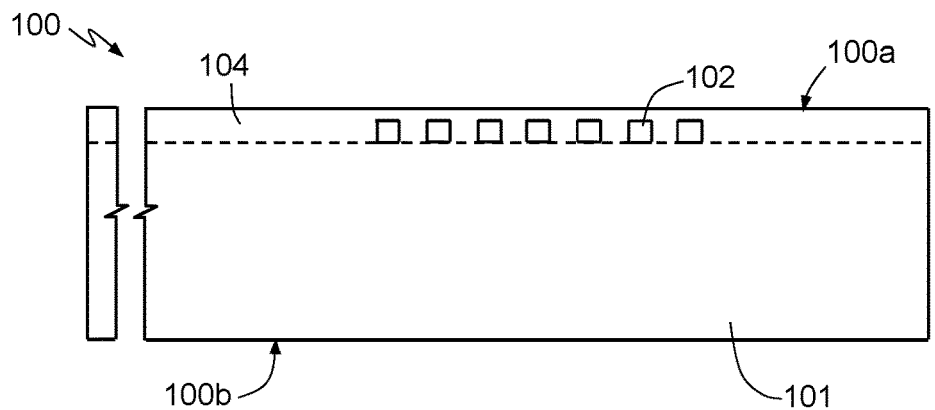

With reference to FIG. 6B, a structural layer 104 is formed on the front surface 100a of the wafer 100, having a thickness greater than the thickness of the oxide layer 102 so as to extend between the openings of the oxide layer 102 and cover the oxide layer 102 entirely. In detail, the thickness of the structural layer 104 is the same as the thickness desired for the filtering layer, and is thus for example comprised between 1 μm and 10 μm. The structural layer 104 is of semiconductor material such as silicon or polysilicon grown, which may include epitaxially grown, on the substrate 101.

Figure 6C:
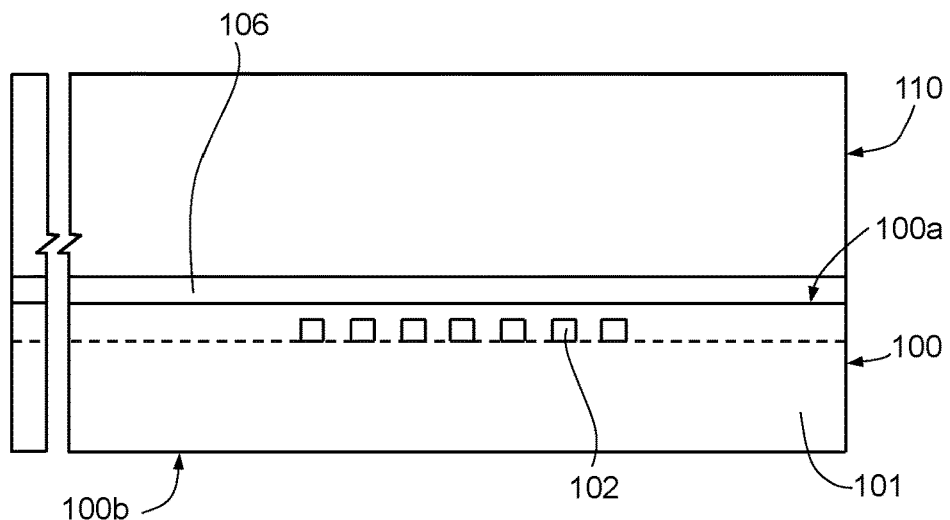
Figure 6D:
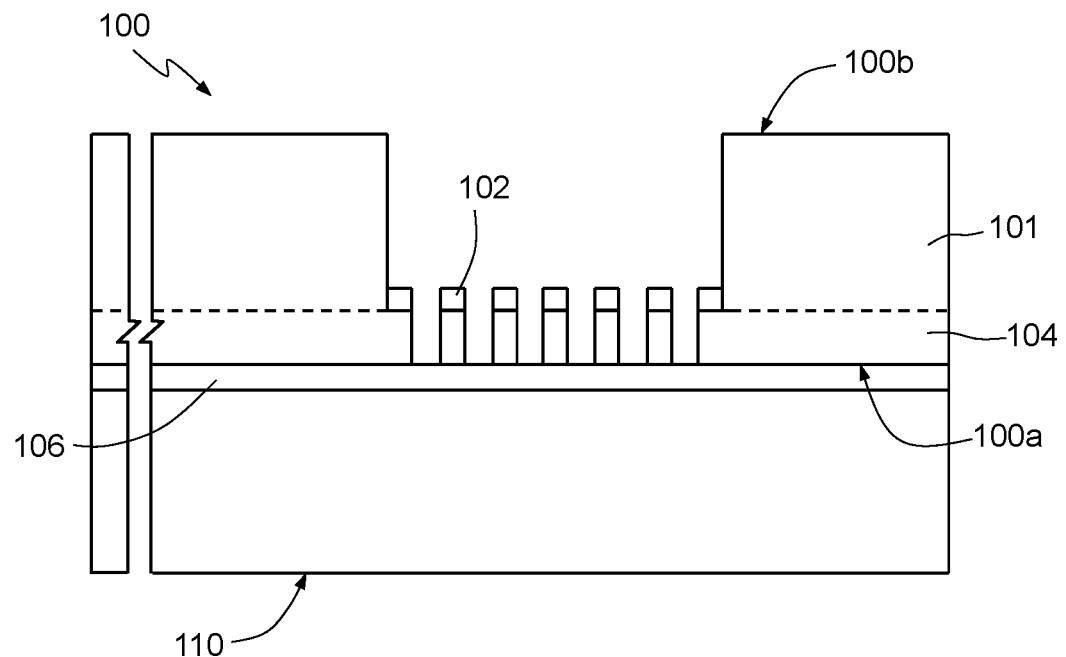

With reference to FIG. 6C, a carrier wafer 110 is provided. The carrier wafer 110 is, for example, of semiconductor material, such as silicon, having a thickness comprised, for instance, between 500 μm and 1000 μm. The carrier wafer 110 is mechanically bonded to the front surface 100a of the wafer 100 via a bonding layer 106 using wafer-to-wafer bonding techniques of a per se known type. For instance, a direct bonding technique may be used, or else a glass-frit technique, in the case where the bonding layer 106 has a silicon-dioxide base. In other embodiments, the bonding layer 106 may comprise metal alloys (e.g., Al/Ge) or else biadhesive layers.

The thickness of the substrate 101 is reduced down to a thickness comprised between 30 μm and 120 μm, in particular 50 μm, via grinding of the rear surface 100b of the wafer 100.

A masked etch of the wafer 100 is carried out (FIG. 6D), on its rear surface 100b, using a photolithographic mask having an opening that surrounds entirely, in top plan view, the openings of the oxide layer 102.

Masked etching of the wafer 100 is carried out via techniques of surface micromachining of a known type, using etching chemistries that selectively remove the material of the substrate 101 but not the materials of the oxide layer 102 and of the bonding layer 106, which functions as an etch-stop layer. Consequently, at the end of masked etching of the wafer 100, through openings are formed in the structural layer 104, thus forming the through openings 58 of the filtering layer 56, as described previously. The thickness of the filtering layer 56 is given by the thickness of the structural layer 104 and, where present, of the oxide layer 102. In this embodiment, since the oxide layer 102 faces, in use, the sound port 28, it bestows characteristics of hydrophobicity on the filtering module.

In an alternative embodiment (not illustrated), the oxide layer 102 is removed so that the thickness of the filtering layer 56 coincides with the thickness of the structural layer 104. The thickness of the supporting layer 54 coincides with the thickness of the substrate 101.

In a further embodiment (not illustrated) the oxide layer 102 is removed selectively to form the openings 102', but is maintained on the remaining surface regions of the substrate 101. In this case, the layer 104 is in contact with the substrate 101 at the openings 102', and extends, for the remaining portions, over the oxide layer 102. Here, the thickness of the supporting layer 54 is equal to the sum of the thickness of the substrate 101 and of the oxide layer 102.

Figure 6E:
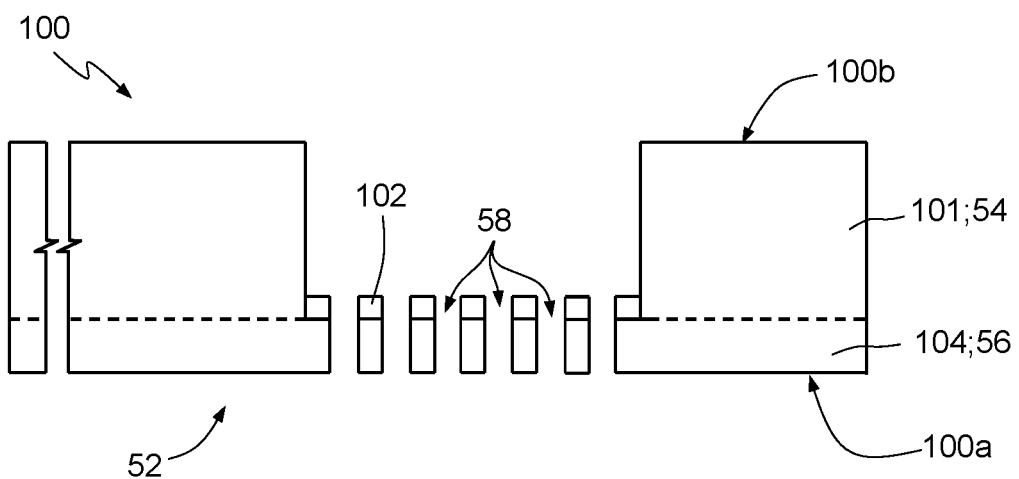

With reference to FIG. 6E, the carrier wafer 110 and the bonding layer 106 are removed via chemical etching and/or debonding techniques.

Finally, in a way not illustrated in the figures, a step of sawing or singulation of the wafer 100 is carried out so as to obtain a plurality of filtering modules 52.

FIGS. 7A-7G show a manufacturing process common to the acoustic transducer device 51 of FIG. 2, to the acoustic transducer device 61 of FIG. 4, and to the acoustic transducer device 71 of FIG. 5, alternative to the manufacturing process of FIGS. 6A-6E.

With reference to FIG. 7A, a wafer 200 is provided having a front side 200a and a back side 200b. The wafer 200 includes a substrate 201 of semiconductor material, such as silicon, which extends between an own front surface 201a and an own rear surface 201b (here coinciding with the back side 200b of the wafer) for a thickness, for example, comprised between 500 μm and 1000 μm. An oxide layer 202 is formed on the front surface 201a of the substrate 201, having the function of etching mask for subsequent steps of the manufacturing process. The oxide layer 202 is made, for example, of silicon oxide ($SiO_2$) having a thickness comprised between 0.5 μm and 3 μm. The oxide layer 202 is formed, for example, by a step of deposition of silicon oxide and/or thermal growth of silicon oxide.

With reference to FIG. 7B, in the oxide layer 202 a plurality of openings 204 are formed in the regions of the wafer 200 in which the through openings 58 of the filtering layer 56 will be formed in order to provide through openings 58, which have a desired shape, as discussed previously. Further, in the oxide layer 202 an edge opening 206 is formed in the regions of the wafer 200 in which openings will be formed that are to separate from one another the filtering modules 52 obtained from the wafer 200 at the end of the manufacturing process. In top plan view (not illustrated in the figures) the edge opening 206 surrounds the plurality of openings 204 entirely. The openings of the oxide layer 202 are formed by techniques in themselves known of photolithography and chemical etching.

With reference to FIG. 7C, at the front side 200a of the wafer 200 a first structural layer 208 is formed, having a thickness greater than the thickness of the oxide layer 202 so as to extend between the plurality of openings 204, within the edge opening 206, and so as to cover the oxide layer 202 entirely. In detail, the thickness of the first structural layer 208 is comprised between 1 μm and 10 μm. The first structural layer 208 is made of semiconductor material such as silicon or polysilicon grown on the substrate 201. The first structural layer 208 forms, in subsequent steps of the manufacturing process, the filtering layer 56.

An etch-stop layer 210 is formed on the first structural layer 208. The etch-stop layer 210 is patterned in such a way that, in plan view in the plane xy, it is superimposed on the plurality of openings 204 but not on the edge opening 206.

The etch-stop layer 210 is made, for example, of tetraethyl orthosilicate (TEOS) and has a thickness comprised between 0.5 μm and 3 μm.

With reference to FIG. 7D, a second structural layer 212 is formed at the front side 200a of the wafer 200, having a greater thickness than the etch-stop layer 210, so as to extend on the first structural layer 208 and on the etch-stop layer 210, entirely covering the etch-stop layer 210. In detail, the thickness of the second structural layer 212 is comprised between 10 μm and 60 μm, in particular 20 μm. The second structural layer 212 is made of semiconductor material such as silicon or polysilicon grown, such as epitaxially or any other ways, on the first structural layer 208. The first structural layer 208 forms, in subsequent steps of the manufacturing process, the filtering layer 56.

A masked etching of the second structural layer 212 is carried out, using a mask having an opening with extension in the plane xy substantially coinciding with that of the etch-stop layer 210. Etching of the second structural layer 212 is performed via techniques of surface micromachining of a known type, using etching chemistries that selectively remove the material of the second structural layer 212 until the etch-stop layer 210 is exposed.

With reference to FIG. 7E, a chemical etch of the etch-stop layer 210 is performed. Chemical etching of the etch-stop layer 210 is, for example, of a wet type, in particular based upon the use of hydrofluoric acid (HF), and is selective in regard to the first and second structural layers 208, 212. At the end of the etching step, the etch-stop layer 210 is completely removed.

With reference to FIG. 7F, the wafer 200 is placed, at its front side 200a, on an adhesive tape (or film) 214. The thickness of the substrate 201 is reduced to a thickness comprised between 400 μm and 725 μm, via grinding on the back side 200b of the wafer 200.

With reference to FIG. 7G, a non-masked chemical etch is carried out on the back side 200b of the wafer 200, entirely removing the substrate 201 and selective portions of the first and second structural layers 208, 212 not protected by the oxide layer 202. In this way, there are obtained the through openings 58 of the filtering layer 56 and singulation of the wafer 200 so as to obtain a plurality of filtering modules 52. In particular, regions of the first structural layer 208 separated by the singulation step form respective filtering layers 56 of respective filtering modules 52. Further, regions of the second structural layer 212 separated by the singulation step form respective supporting layers 54 of respective filtering modules 52. Each filtering module 52 is detached from the adhesive tape 214 and assembled on the first die 21.

The manufacturing process of FIGS. 7A-7G makes it possible to obtain a smaller thickness of the supporting layer 54, and consequently of the filtering module 52, as compared to the manufacturing process of FIGS. 6A-6E, since said thickness is determined by the growth of the layer 212, with which thicknesses may be obtained that are much smaller than the ones that may be achieved by grinding. The flexibility of mutual arrangement of the filtering module 52 and of the first die 21 thus increases, favoring, for example, implementation of the acoustic transducer device 51 of FIG. 2, and in particular of the acoustic transducer device 71 of FIG. 5, without any need to increase the thickness of the package 50.

FIGS. 8A-8F show a manufacturing process common to the acoustic transducer device 51 of FIG. 2, to the acoustic transducer device 61 of FIG. 4, and to the acoustic transducer device 71 of FIG. 5, and alternative to the manufacturing processes described previously.

Following upon the steps already described with reference to FIG. 7A (providing a wafer 300 including a substrate 301 on which a silicon-oxide layer 302 extends), a deposition is carried out (FIG. 8A) of a first structural layer 308 on the silicon-oxide layer 302, to obtain a layer similar to the first structural layer 208 of FIG. 7C. However, in the case of FIG. 8A, the silicon-oxide layer 302 has not been previously patterned.

A mask layer 310 (made, for example, of TEOS) is formed, which extends over the entire surface of the structural layer 308. The mask layer 310 is patterned like the oxide layer 202 of FIG. 7B.

With reference to FIG. 8B, a second structural layer 312 is formed in a way similar to the first structural layer 212 of FIG. 7C. With reference to FIG. 8C, a masked etching of the first and second structural layers 308, 312 is carried out, using a mask 314 having openings that are entirely superimposed, in plan view in the plane xy, on the openings of the mask layer 310. Etching of the first and second structural layers 308, 312 is carried out via techniques of surface micromachining of a known type, using etching chemistries that remove selectively the material of the first and second structural layers 308, 312 until the silicon-oxide layer 302 is reached (FIG. 8D). In this way, trenches are formed, which extend throughout the thickness of the first and second structural layers 308, 312, carrying out a singulation of the wafer 300 in order to obtain, at the end of the manufacturing process, a plurality of filtering modules 52. In this way, trenches are further formed, which extend throughout the thickness of the first structural layer 308 and form, in subsequent steps of the manufacturing process, the through openings 58 of the filtering layer 56.

With reference to FIG. 8E, the wafer 300 is placed, at a front side 300a thereof, on an adhesive tape (or film) 316. The thickness of the substrate 301 is reduced to a thickness comprised between 400 µm and 725 µm, via grinding performed on a back side 300b of the wafer 300.

With reference to FIG. 8F, a non-masked chemical etch is carried out on the back side 300b of the wafer 300, entirely removing the substrate 301. The silicon-oxide layer 302 is removed. Each filtering module 52 is detached from the adhesive tape 316 and assembled on the first die 21.

The manufacturing process of FIGS. 8A-8F makes it possible to obtain a smaller thickness of the supporting layer 54, and consequently of the filtering module 52, as compared to the manufacturing process of FIGS. 6A-6E, since also in this case the final thickness is arranged by the steps of epitaxial growth or other growth methods of the layer 312, and not by a grinding step. The flexibility of mutual arrangement of the filtering module 52 and of the first die 21 thus increases, favoring, for example, implementation of the acoustic transducer device 51 of FIG. 2, and in particular of the acoustic transducer device 71 of FIG. 5, without any need to increase the thickness of the package 50. Further, unlike the manufacturing process of FIGS. 7A-7G, the presence of the mask layer 310, of silicon oxide, which in use faces the sound port 28, bestows characteristics of hydrophobicity on the filtering module 52.

Figure 9:
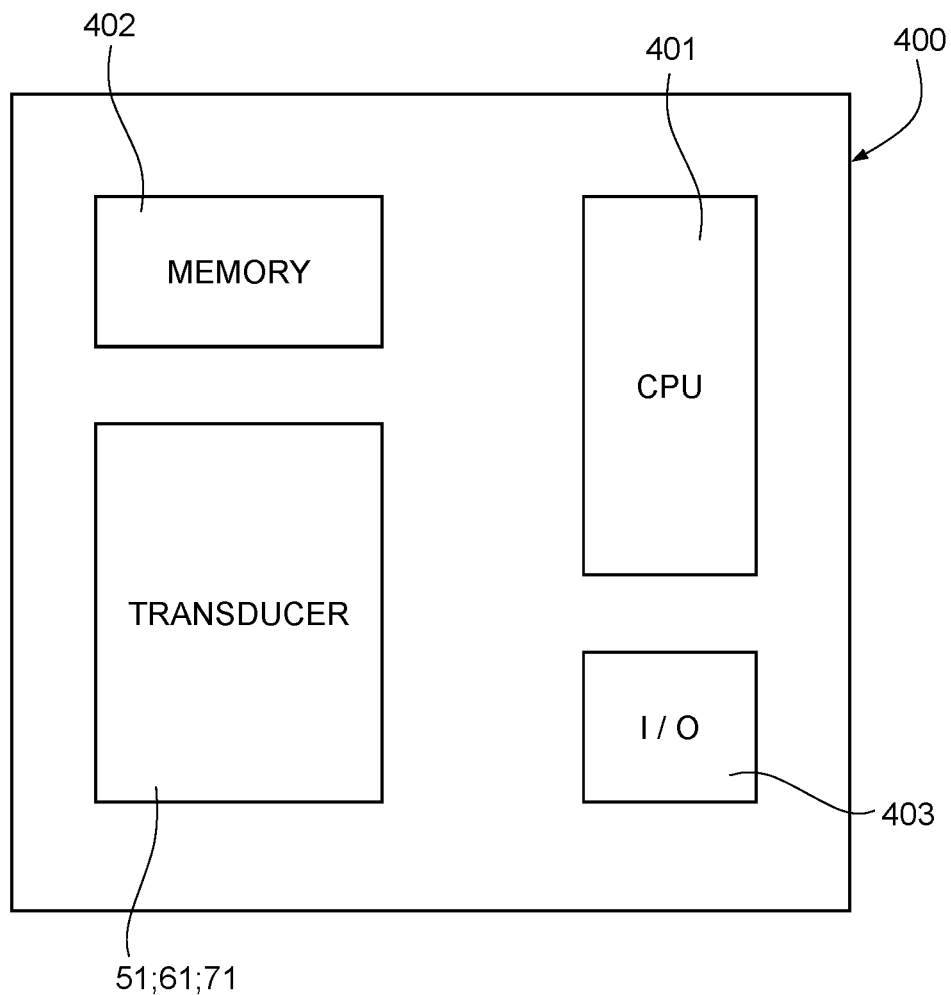
FIG. 9 shows an electronic system including an acoustic transducer device according to any one of the embodiments of FIGS. 2, 4, and 5.

FIG. 9 shows an electronic system 400 that uses the acoustic transducer device 51, 61, 71 according to the respective embodiment of FIGS. 2, 4, and 5.

The electronic system 400 comprises, in addition to the acoustic transducer device 51, 61, 71, a microprocessor (CPU) 401, a memory block 402, connected to the microprocessor 401, and an input/output interface 403, for example, a keypad and/or a display, which is also connected to the microprocessor 401.

The acoustic transducer device 51, 61, 71 communicates with the microprocessor 401, and in particular transduces the electrical signals processed by the ASIC 22' of the second die 22 associated to the MEMS sensing structures of the first die 21.

The electronic system 400 is, for example, a mobile communication device, a cellphone, a smartphone, a computer, a tablet, a PDA, a notebook, a wearable device, such as a smartwatch, a voice recorder, a player of audio files with voice-recording capacity, a console for videogames, etc.

From an examination of the characteristics of the invention described and illustrated herein the advantages that it affords are evident.

For instance, minimization of the thickness of the filtering module 52, due to the use of semiconductor layers and to the possibility of carrying out singulation of the wafer at the end of the manufacturing process (back end of line) means that the impact of the filtering module 52 on the signal-to-noise ratio of the acoustic transducer device is negligible.

Further, the small thickness of the filtering module 52 enables formation of a stack between the filtering module and the microphone, thus further reducing the impact of the filtering module 52 on the acoustic performance of the acoustic transducer device.

Further, it is possible to integrate the filtering module 52 in the acoustic transducer device with greater flexibility as compared to the prior art.

Finally, it is clear that modifications and variations may be made to the invention described and illustrated herein, without thereby departing from the scope thereof.

For instance, the filtering module 52 may have different shapes in plan view in the plane xy, for example circular or elliptical or generically polygonal, or polygonal with rounded corners.

Further, it is possible to carry out additional steps in the manufacturing process of FIGS. 7A-7G designed to form a layer of hydrophobic material (e.g., $SiO_2$) on the surface of the filtering layer 56 that faces, in use, the sound port 28.

In addition, with reference to all the embodiments described previously, it is possible to envisage integration of conductive paths on the surface of the filtering layer 56 that faces, in use, the sound port 28. Appropriate paths for connection to biasing means external to the filtering module 52 may be integrated in the base substrate 23 and used for electrostatically biasing the filtering layer 56 in order to bestow characteristics of hydrophobicity on the filtering module 52. For this purpose, the base substrate 23 may be a substrate of an LGA type, comprising an inner core and one or more metal layers that extend on opposite faces of the core. The core is, for example, defined by a die of rigid dielectric material, for example FR4.

Further, it is possible to arrange the stack formed by the filtering module 52 and by the first die 21 (as represented in FIG. 5) in a recess of the base substrate 23 (of the type illustrated in FIG. 4).

Finally, for each of the embodiments described previously, there may be envisaged a different configuration of the MEMS acoustic transducer device, in particular as regards the geometrical shape of the constituent elements. In the case where the space inside the package so allows, there may possibly be housed within the package itself also a number of MEMS sensors in addition to the MEMS acoustic transducer, each possibly provided with a sensitive element that requires a communication towards the external environment. Further integrated circuits (e.g., ASICs) may further be provided and housed within a same package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An acoustic transducer device, comprising:
a package having a base substrate and a covering element that together define an inner space of the package, the base substrate having a sound port in acoustic communication with an environment external to the package;
a MEMS acoustic transducer in the inner space of the package and having an acoustic chamber facing the sound port; and
a filtering module in the inner space of the package and arranged between the MEMS acoustic transducer and the sound port, the filter module including a filtering membrane with a plurality of through openings in fluid connection with the sound port and the acoustic chamber, the filtering membrane being made of semiconductor material and having a thickness that is less than 10 microns ($\mu$m),
wherein the base substrate comprises a recess between the sound port and the inner space, and wherein the filtering module is at least partially in the recess.

2. The acoustic transducer device according to claim 1, wherein each of the plurality of through openings has a shape and size such as to inhibit passage of contaminating particles having a size larger than 5 $\mu$m.

3. The acoustic transducer device according to claim 1, wherein a ratio between a sum of volumes of the plurality of through openings and volumes of suspended portions of the filtering membrane is comprised between 0.3 and 0.7.

4. The acoustic transducer device according to claim 1, wherein the semiconductor material is silicon.

5. The acoustic transducer device according to claim 1, wherein the filtering module further comprises a supporting layer of silicon having a thickness between 30 $\mu$m and 120 $\mu$m, wherein the supporting layer is on the base substrate, and wherein the filtering membrane is on the supporting layer.

6. The acoustic transducer device according to claim 1, wherein the MEMS acoustic transducer is on the filtering module and forms a stack.

7. The acoustic transducer device according to claim 1, wherein the filtering membrane is entirely contained within the acoustic chamber.

8. The acoustic transducer device according to claim 1, wherein the filtering membrane comprises a layer of hydrophobic material facing the sound port.

9. An electronic system, comprising:
a microprocessor; and
an acoustic transducer device coupled to the microprocessor, the acoustic transducer device including:
a package having a base substrate and a covering element that together define an inner space of the package, the base substrate having a sound port in acoustic communication with an environment external to the package;
a MEMS acoustic transducer in the inner space of the package and having an acoustic chamber facing the sound port; and
a filtering module in the inner space of the package and arranged between the MEMS acoustic transducer and the sound port, the filter module including a filtering membrane with a plurality of through openings in fluid connection with the sound port and the acoustic chamber, the filtering membrane being made of semiconductor material and having a thickness that is less than 10 $\mu$m, wherein the filtering module further comprises a supporting layer of silicon having a thickness between 30 $\mu$m and 120 $\mu$m.

10. The electronic system according to claim 9, wherein the electronic system is at least one of: a mobile communication device, a cellphone, a smartphone, a computer, a tablet, a PDA, a notebook, a wearable device, a smartwatch, a voice recorder, a player of audio files with voice-recording capacity, or a console for videogames.

11. The electronic system according to claim 9, wherein the filtering membrane comprises a layer of hydrophobic material facing the sound port.

12. The electronic system according to claim 9, wherein each of the plurality of through openings has a shape and size such as to inhibit passage of contaminating particles having a size larger than 5 $\mu$m.

13. The electronic system according to claim 9, wherein the base substrate comprises a recess between the sound port and the inner space, and wherein the filtering module is at least partially in the recess.

14. A method for assembling an acoustic transducer device, the method comprising:
placing a filtering module between a MEMS acoustic transducer and a sound port of a package body, the package body including a base substrate, the filtering module including a filtering membrane having a plurality of through openings, the filtering membrane being of semiconductor material and having a thickness that is less than 10 $\mu$m,
placing a cap over the substrate enclosing the MEMS acoustic transducer, and
wherein the filtering module comprises a supporting layer of silicon having a thickness between 30 $\mu$m and 120 $\mu$m, wherein the supporting layer is on the base substrate, and wherein the filtering membrane is on the supporting layer.

15. The method according to claim 14, wherein the filtering membrane inhibits passage of contaminating particles above 5 $\mu$m.

16. The method according to claim 14, wherein each of the plurality of through openings has a shape and size such as to inhibit passage of contaminating particles having a size larger than 5 $\mu$m.

17. The method according to claim 14, wherein the semiconductor material is silicon.

* * * * *